United States Patent
Seo et al.

(10) Patent No.: US 7,148,514 B2
(45) Date of Patent: Dec. 12, 2006

(54) NITRIDE SEMICONDUCTOR LIGHT EMITTING DIODE AND FABRICATION METHOD THEREOF

(75) Inventors: Jun Ho Seo, Kyungki-do (KR); Jong Ho Jang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 55 days.

(21) Appl. No.: 10/870,467

(22) Filed: Jun. 18, 2004

(65) Prior Publication Data
US 2005/0133796 A1    Jun. 23, 2005

(30) Foreign Application Priority Data
Dec. 23, 2003    (KR) .................... 10-2003-0095172

(51) Int. Cl.
H01L 27/15    (2006.01)
H01L 29/26    (2006.01)
H01L 31/12    (2006.01)
H01L 33/00    (2006.01)
H01L 29/06    (2006.01)

(52) U.S. Cl. .................... 257/79; 257/13; 257/81; 257/85; 257/88; 257/90; 257/94; 257/96; 257/98; 257/103; 257/918; 257/E27.12; 257/E27.105; 257/E33.001; 257/E33.015; 257/E33.023; 257/E33.024; 257/E33.025; 257/E33.026; 257/E33.027; 257/E33.049; 257/E33.068

(58) Field of Classification Search .................... 257/13, 257/79, 71, 85, 88, 90, 94, 103, 918, E27.12, 257/E27.105, E33.001, E33.015, E33.023, 257/E33.024, E33.025, E33.026, E33.027, 257/E33.049, E33.068
See application file for complete search history.

(56) References Cited

U.S. PATENT DOCUMENTS

| | | | | |
|---|---|---|---|---|
| 5,358,880 A | * | 10/1994 | Lebby et al. | 438/26 |
| 5,799,030 A | * | 8/1998 | Brenner | 372/50.21 |
| 6,046,065 A | * | 4/2000 | Goldstein et al. | 438/46 |
| 6,130,441 A | * | 10/2000 | Bowers et al. | 257/15 |
| 6,459,716 B1 | * | 10/2002 | Lo et al. | 372/50.1 |
| 6,707,840 B1 | * | 3/2004 | Goossen | 372/96 |
| 6,875,627 B1 | * | 4/2005 | Bour et al. | 438/22 |
| 6,949,395 B1 | * | 9/2005 | Yoo | 438/47 |
| 6,960,485 B1 | * | 11/2005 | Uemura et al. | 438/33 |
| 2002/0110169 A1 | * | 8/2002 | Iwai et al. | 372/43 |
| 2003/0001163 A1 | * | 1/2003 | Tanabe et al. | 257/79 |

(Continued)

FOREIGN PATENT DOCUMENTS

JP    3456938    8/2003
WO    02/103813 A1    12/2002

Primary Examiner—Ida M. Soward
(74) Attorney, Agent, or Firm—Lowe Hauptman & Berner, LLP.

(57) ABSTRACT

The invention relates to a nitride semiconductor LED and a fabrication method thereof. In the LED, a first nitride semiconductor layer, an active region a second nitride semiconductor layer of a light emitting structure are formed in their order on a transparent substrate. A dielectric mirror layer is formed on the underside of the substrate, and has at least a pair of alternating first dielectric film of a first refractivity and a second dielectric film of a second refractivity larger than the first refractivity. A lateral insulation layer is formed on the side of the substrate and the light emitting structure. The LED of the invention effectively collimate undesirably-directed light rays, which may be otherwise extinguished, to maximize luminous efficiency, and are protected by the dielectric mirror layer formed on the side thereof to remarkably improve ESD characteristics.

8 Claims, 7 Drawing Sheets

U.S. PATENT DOCUMENTS

2003/0189215 A1* 10/2003 Lee et al. ..................... 257/94
2004/0017835 A1* 1/2004 Jewell et al. ................. 372/45
2004/0160997 A1* 8/2004 Peters et al. ................. 372/28
2004/0206975 A1* 10/2004 Tojo et al. .................. 257/103
2004/0213315 A1 10/2004 Kume et al. ............... 372/50.1
2004/0238810 A1* 12/2004 Dwilinski et al. ............ 257/12

* cited by examiner

NITRIDE SEMICONDUCTOR LIGHT EMITTING DIODE AND FABRICATION METHOD THEREOF

RELATED APPLICATIONS

The present application is based on, and claims priority from, Korean Application Serial Number 2003-95172, filed Dec. 23, 2003, the disclosure of which is hereby incorporated by reference herein in its entirety.

BACKGROUND OF THE INVENTION

1. Field of the Invention

The present invention relates to a nitride semiconductor light emitting diode, and more particularly, to a nitride semiconductor light emitting diode and a fabrication method thereof, in which a high reflectivity layer is formed to minimize light loss as well as achieve excellent electrostatic discharge characteristics.

2. Description of the Related Art

As well-known in the art, Nitride semiconductor Light Emitting Diodes (LEDs) are being spotlighted as high power optical devices capable of generating single wavelength light such as blue or green light to realize full color display. A nitride semiconductor LED is made by growing single crystal semiconductor expressed as a formula of $Al_xIn_yGa_{(1-x-y)}N$ (wherein $0 \leq x \leq 1$, $0 \leq y \leq 1$ and $0 \leq x+y \leq 1$) on a specific substrate of for example sapphire for growing GaN.

Unlike a GaAs-based red LED that has electrodes formed on the underside of a substrate, the sapphire substrate as a representative substrate for growing GaN has two electrodes formed on crystallized semiconductor layers as shown in FIG. 1a because it is insulated.

Referring to FIG. 1a, a nitride semiconductor LED 10 includes a sapphire substrate 11, a first nitride semiconductor layer 13, an active layer 15 and a second nitride semiconductor layer 17 formed in their order on the sapphire substrate 11. Further, in order to form two electrodes on the semiconductor layers as described above, predetermined regions of the second nitride semiconductor layer 17 and the active layer 15 are etched to form a general mesa structure. The first electrode 18a is arranged on the exposed region of the first nitride semiconductor layer 13, and the second electrode 18b is arranged on the second nitride semiconductor 17.

The nitride semiconductor LED 10, as shown in FIG. 1a, can be loaded on a Printed Circuit Board (PCB) 21 and then covered with resin 28 to form an LED package 20. A circuit pattern including first and second conductive patterns 22a and 22b are formed on the PCB 21, the LED 10 is attached to the second conductive pattern 22b via a conductive paste layer 16, and the electrodes 18b and 18a of the LED 10 are connected to the first and second conductive patterns 22a and 22b via the wires 24a and 24b.

In the package shown in FIG. 1b, light rays generated from the nitride semiconductor LED are projected not only in desirable upward directions but also in downward directions through the transparent sapphire substrate. Light rays directed downward are partially absorbed and extinguished or partially reach the conductive paste layer 16 bonding the LED 10 with the second conductive pattern 22b that reflects the light rays upward. However, because the conductive paste layer 16 itself does not define an irregular surface, high reflectivity can be rarely expected from the conductive paste layer 16 even though it is made of a high reflectivity material such as Ag. Rather, the light rays are scattered from the irregular surface to disappear.

Accordingly, there have been required in the art nitride semiconductor LEDs and a fabrication method thereof which can minimize light loss as well as maximize luminous efficiency by using a suitable reflector structure.

SUMMARY OF THE INVENTION

Therefore the present invention has been made to solve the foregoing problems of the prior art.

It is therefore an object of the present invention to provide a nitride semiconductor LED which can utilize high reflectivity characteristics of a dielectric mirror layer to minimize light loss as well as insulation properties thereof to remarkably improve electrostatic discharge characteristics.

It is another object of the present invention to provide a wafer-level fabrication method of nitride semiconductor LEDs.

According to an aspect of the invention for realizing the above objects, there is provided a nitride semiconductor Light Emitting Diode (LED) comprising: a transparent substrate for growing nitride semiconductor single crystal thereon; a light emitting structure including a first nitride semiconductor layer, an active region a second nitride semiconductor layer formed in their order on the substrate; a dielectric mirror layer formed on the underside of the substrate and having at least a pair of first dielectric film of a first refractivity and a second dielectric film of a second refractivity larger than the first refractivity, the first and second dielectric films being laminated on each other in an alternating fashion; and a lateral insulation layer formed on the side of the substrate and the light emitting structure.

It is preferred that the lateral insulation layer comprises a dielectric mirror layer equal to the dielectric mirror layer formed on the underside of the substrate. It is preferred that the first and second dielectric films comprise oxide or nitride containing one element selected from a group including Si, Zr, Ta, Ti and Al. It is also preferred that each of the first and second dielectric films has a thickness of about 300 to 900 Å.

Representatively, each of the first and second dielectric films may comprise a $SiO_2$ film or a $Si_3N_4$ film, wherein the $SiO_2$ film may have a thickness of about 600 to 600 Å, and the $Si_3N_4$ film has a thickness of about 400 to 600 Å.

According to the present invention, the dielectric mirror layer preferably may have a reflectivity of at least 90%, and more preferably a reflectivity of at least 95%.

According to an aspect of the invention for realizing the above objects, there is provided a wafer-level fabrication method of nitride semiconductor Light Emitting Diodes (LEDs), the method comprising the following steps of: preparing a transparent wafer for growing single crystal nitride semiconductor thereon; forming a light emitting structure including a first nitride semiconductor layer, an active layer and a second nitride semiconductor layer laminated in their order on the wafer; cutting the wafer together with the light emitting structure into the size of LED to expose the side of each LED; and laminating at least one alternating pair of first and second dielectric materials on the side and the underside of the LED, the first dielectric material having a first refractivity and the second dielectric material having a second refractivity larger than the first refractivity, whereby the first and second dielectric materials are laminated at least on the underside of the LED to form a dielectric mirror layer.

It is preferred that the step of cutting the wafer together with the light emitting structure into the size of LED may include: attaching a tape on the light emitting structure, cutting the wafer from the underside into LEDs and stretching the tape to sufficiently expose the side of the cut LEDs.

It is also preferred that the first and second dielectric materials are laminated on the side of the LED at substantially same thickness and number as the first and second dielectric materials on the underside of the LED to form a dielectric mirror layer.

BRIEF DESCRIPTION OF THE DRAWINGS

The above and other objects, features and other advantages of the present invention will be more clearly understood from the following detailed description taken in conjunction with the accompanying drawings, in which:

FIG. 1b is an LED package incorporating the LED in FIG. 1a;

DETAILED DESCRIPTION OF THE PREFERRED EMBODIMENT

Hereinafter the present invention will be described in more detail with reference to the accompanying drawings.

Figure 1A:
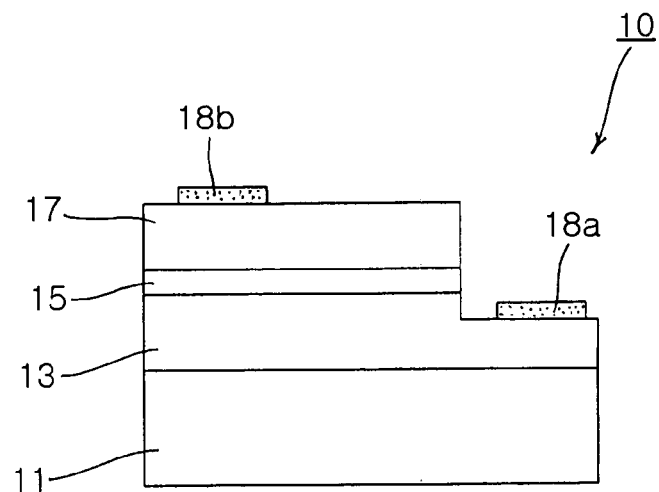
FIG. 1a is a sectional view illustrating a conventional nitride semiconductor LED.
Figure 1B:
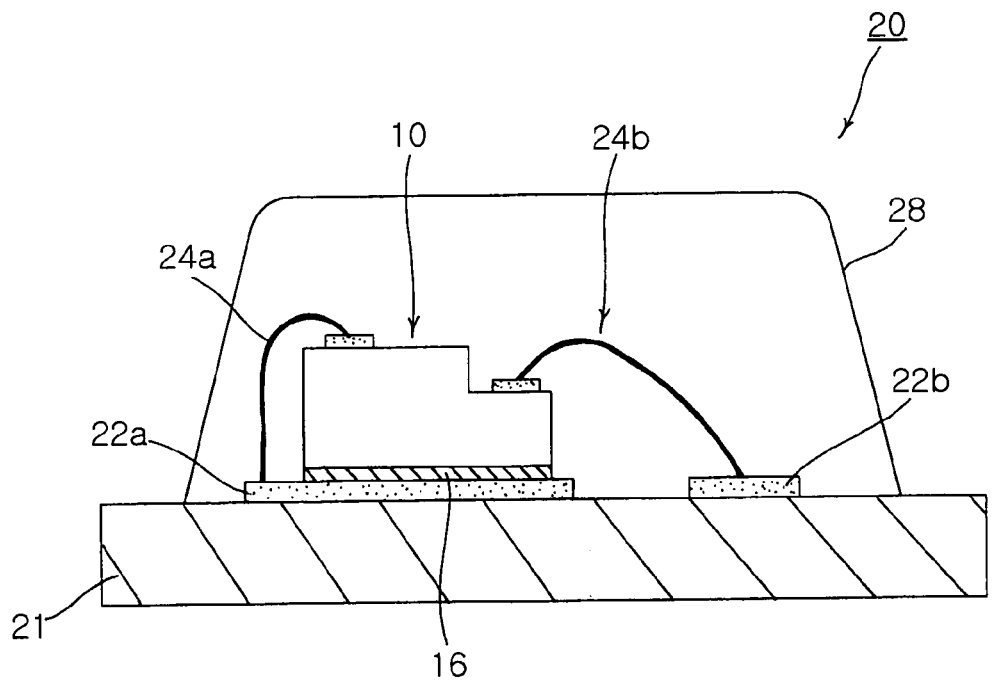
Figure 2A:
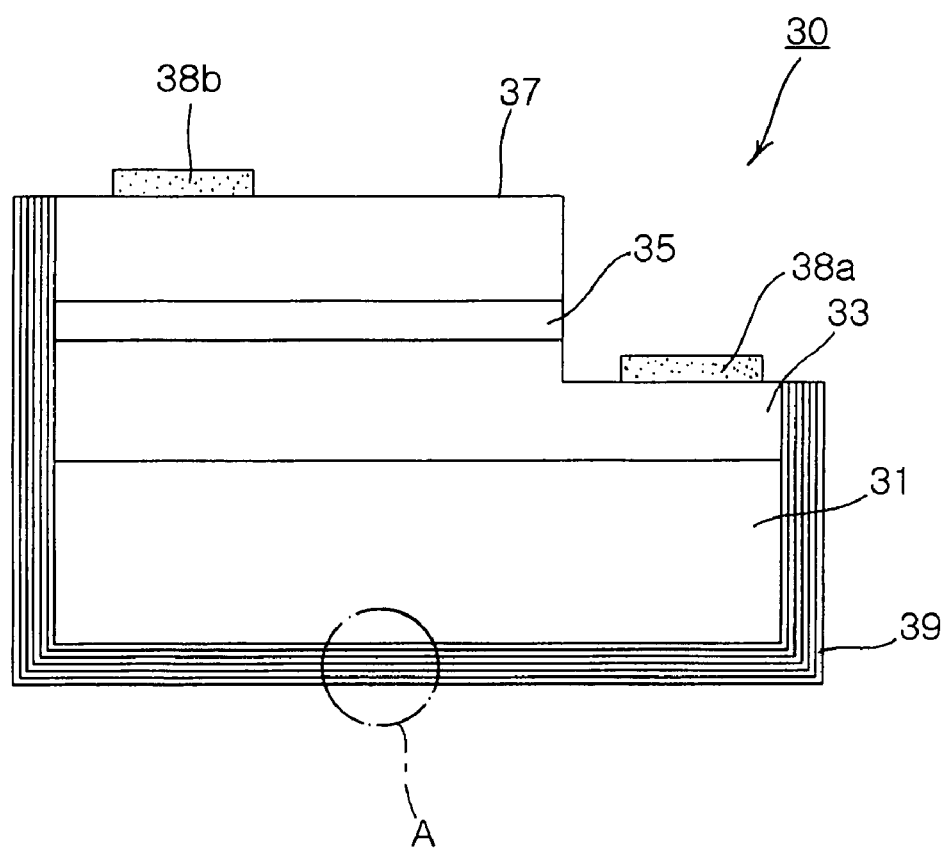
FIG. 2a is a sectional view illustrating a nitride semiconductor LED according to a first embodiment of the invention.
Figure 2B:
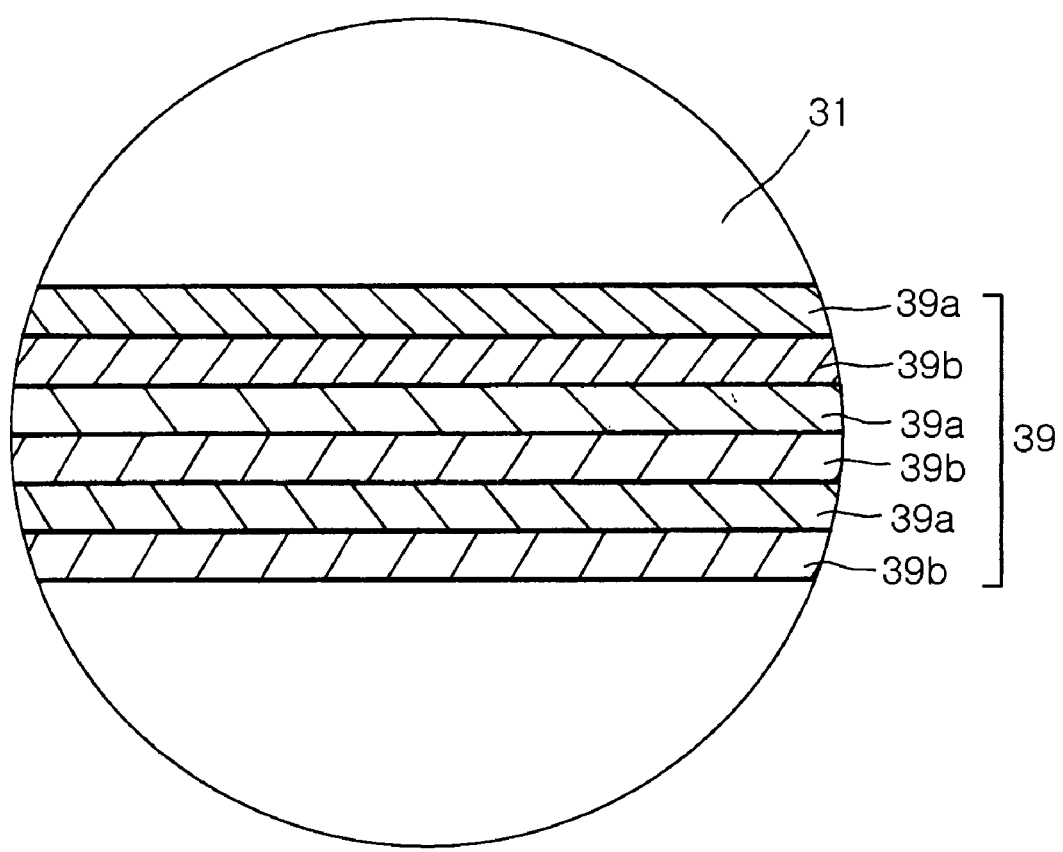
FIG. 2b is a magnification of the part A in FIG. 2a for illustrating the sectional configuration of a multilayer mirror structure adopted to the LED.

FIG. 2a is a sectional view illustrating a nitride semiconductor LED according to a first embodiment of the invention.

Referring to FIG. 2a, a nitride semiconductor LED 30 includes a transparent substrate 31 for growing nitride semiconductor thereon, a first nitride semiconductor substrate 33, an active region or layer 35 and a second nitride semiconductor layer 37 formed in their order on the substrate 31. The first and second electrodes 38a and 38b are formed respectively on a predetermined region of the first nitride semiconductor layer 33 exposed by mesa etching and the second semiconductor layer 35.

For example, the transparent substrate 31 may be made of sapphire, and the first nitride semiconductor layer 33 may be formed of an n-doped GaN layer. The active layer 35 may be formed of an undoped InGaN layer of a multi-quantum well structure, and the second nitride semiconductor layer 37 may be formed of a p-doped GaN layer and a p-doped AlGaN layer.

The nitride semiconductor LED 30 of the invention includes a dielectric mirror layer 39 formed on both the side and the underside. As shown in FIG. 3b, the dielectric mirror layer 39 has three pairs of alternating first and second dielectric materials or films 39a and 39b, but is not limited thereto. The first dielectric films 39a have a first refractivity, and the second dielectric films 39b have a second refractivity higher than the first refractivity. The material type, thickness and alternating number (i.e., the number of pairs) of the dielectric mirror layer 39 can be so set that the dielectric mirror layer 39 has a suitable reflectivity according to oscillation wavelength.

Preferably, the dielectric films 39a and 39b may be made of oxide or nitride containing one element selected from the group consisting of Si, Zr, Ta, Ti and Al. The dielectric material shows substantially no light loss owing to its low absorptivity nearing zero, and can realize high reflectivity based upon the refractivity difference of the multilayer dielectric films of the dielectric mirror layer. The dielectric mirror layer 39 adopted in the invention can have a reflectivity of about 80%, preferably 90%, and more preferably 98%.

Each of the first and second dielectric films 39a and 39b preferably has a thickness of about 300 to 900 Å regarding a typical wavelength range (e.g., about 350 to 550 mm) oscillated from the nitride semiconductor LED. Representative examples of the dielectric films may include a $SiO_2$ film and a $Si_3N_4$ film. The $SiO_2$ film is used to form a lower refractivity layer with relation to that formed by the $Si_3N_4$ film. It is preferred that the $SiO_2$ film has a thickness of about 600 to 800 Å and the $Si_3N_4$ film has a thickness of about 400 to 600 Å. Table 1 below illustrates a dielectric mirror layer structure for realizing high reflectivity of at least 98%:

TABLE 1

| Oscillation wavelength | Material | Thickness | Refractivity | Number of Pairs | Reflectivity |
|---|---|---|---|---|---|
| 390 nm | $SiO_2$ | 663 | 1.47 | 6 | 98 |
|  | $Si_3N_4$ | 469 | 2.0787 |  |  |
| 450 nm | $SiO_2$ | 765 | 1.47 | 6 | 98.5 |
|  | $Si_3N_4$ | 547 | 2.0547 |  |  |
| 470 nm | $SiO_2$ | 799 | 1.47 | 6 | 98 |
|  | $Si_3N_4$ | 573 | 2.0489 |  |  |

It is reported that the dielectric mirror layer 39 composed according to conditions in Table 1 above has a high reflectivity of at least 98% with respect to an oscillation wavelength range from 390 to 470 nm. Instead of being scattered or absorbed from/into a defective reflective surface, the most of light directed downward in the diode is reflected upward by the dielectric mirror layer of the invention.

The semiconductor LED of the invention also has an insulation layer formed on the side. This lateral insulation layer provides protection to the outside surface of the diode as well as the electrically-insulated dielectric mirror layer. That is, although an LED with an exposed lateral portion may be destructed by surge voltage, the LED 30 shown in FIG. 2a can have excellent reliability of fine Electrostatic Discharge (ESD) characteristics because the insulation layer is formed also on the side.

The lateral insulation layer may be formed of an insulating material different from that of the dielectric mirror layer only on the side of the LED, separate from the formation of the dielectric mirror layer. Alternatively, the lateral insulation layer on the side of the LED may be formed simultaneous with the dielectric mirror layer 39, with the same dielectric mirror layer as the dielectric mirror layer 39.

Figure 3:
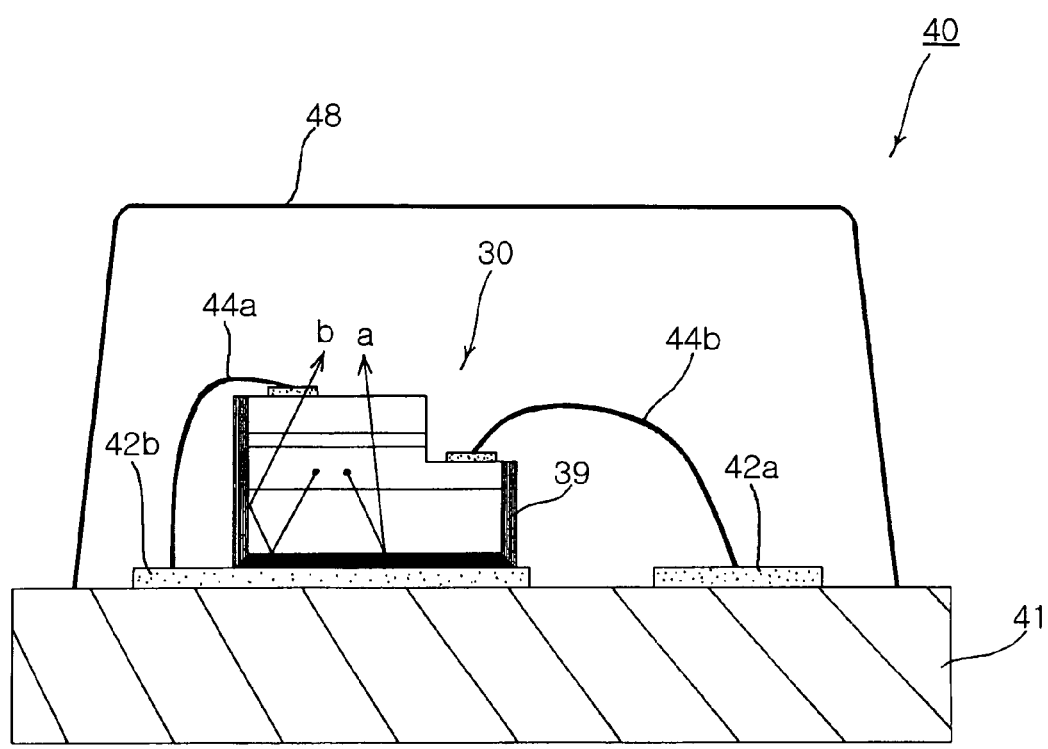
FIG. 3 is a sectional view illustrating a package having the semiconductor LED according to the invention.

FIG. 3 is a sectional view illustrating a package having the semiconductor LED according to the invention.

Referring to FIG. 3, a nitride semiconductor LED package 40 includes a PCB 41, a nitride semiconductor LED 30 mounted on the PCB 41 and 1 transparent resin structure 48 formed around the LED 30 mounted on the PCB 41.

The PCB 41 includes first and second conductive patterns 42a and 42b formed thereon. The LED 30 has a dielectric mirror layer 39 formed beneath and around the LED 30, and is bonded onto the second conductive pattern 42b via an adhesive (not shown) made of conductive paste such as Ag. Further, the LED 30 has electrodes (e.g., 38b and 38a in FIG. 2a) which are connected respectively to the first and second conductive patterns 42a and 42 b.

In the package 40 adopting the LED 30 of the invention, even if directed downward through a transparent sapphire substrate, a light ray a generated from the nitride semiconductor LED 30 is not scattered or absorbed from/into a reflective surface, which is uneven owing to the adhesive, but reflects upward from the high reflectivity dielectric mirror layer 39. Also, because the dielectric mirror layer 39 is formed around the lateral portion of the LED 30 of the invention, a light ray b directed toward the lateral portion can be re-reflected upward. Therefore, the invention effectively forms the high reflectivity dielectric mirror layer also on the side of the LED As a result, the LED of the invention has the high reflectivity dielectric mirror layer formed up to the side of the LED to minimize substantial extinction of undesirably directed light rays thereby maximizing resultant luminous efficiency. Further, the LED of the invention is protected at both the side and the underside by the electrically-insulated dielectric mirror layer to improve ESD characteristics.

FIGS. 4a to 4e are sectional views illustrating a fabrication method of a plurality of nitride semiconductor LEDs according to the invention. The wafer-level fabrication process of nitride semiconductor LEDs will provide more apparent understanding to an advantage of the invention that further facilitates the formation of the dielectric mirror layer of the invention.

Figure 4A:
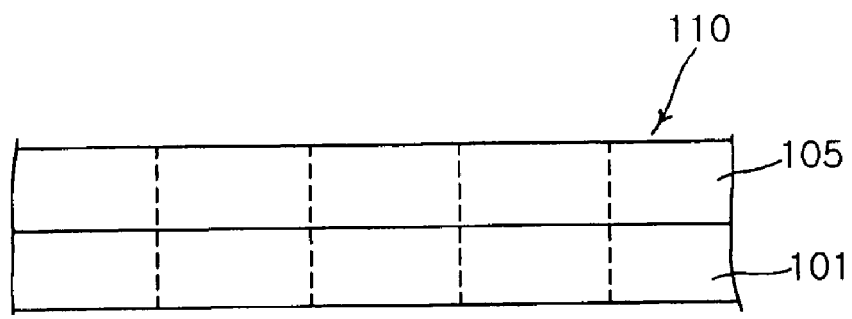
FIGS. 4a to 4e are sectional views illustrating a fabrication method of nitride semiconductor LEDs according to the invention.

As shown in FIG. 4a, a light emitting structure 105 including a first nitride semiconductor layer, an active layer and a second nitride semiconductor layer is formed on a transparent wafer 101 of for example sapphire for growing nitride thereon. In a following step, the sapphire wafer 101 together with the light emitting structure 105 can be divided into respective unit LEDs 110 as indicated with dotted lines.

Figure 4B:
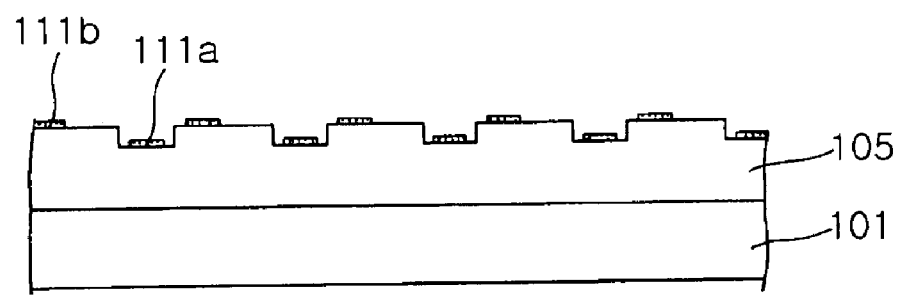

Then, in each unit LED 110, a first electrode 111a is formed on an exposed region of the first nitride semiconductor layer, which is exposed via mesa etching, and a second electrode 111b is formed on the second nitride semiconductor layer as shown in FIG. 4b. For example, a p-electrode can be provided by forming a transparent electrode layer on the p-doped nitride semiconductor layer and then a bonding metal on the transparent electrode layer.

Figure 4C:
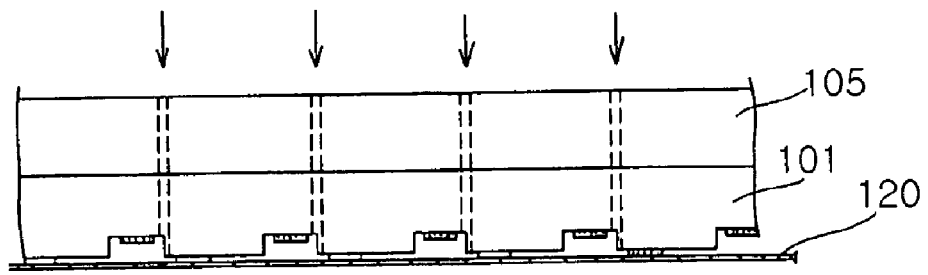
Figure 4D:
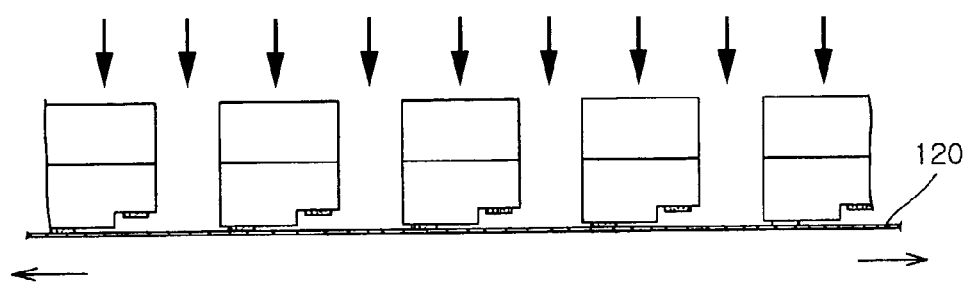
Figure 4E:
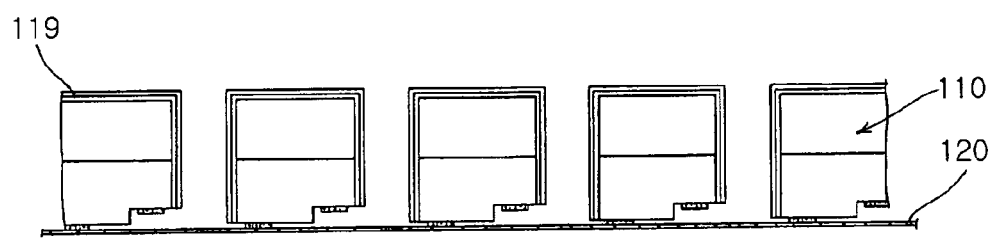

Then, the wafer having the light emitting structure is cut according to the size of unit LED exposing the side of the unit LEDs, which in turn are provided at the side and the underside with suitable dielectric mirror layers made of a desired dielectric material. Preferably, this process can be performed according to the steps as shown in FIGS. 4c to 4e, starting with the step of attaching a tape 120 on the light emitting structure. A resultant structure attached with the tape 120 is placed with the upside down so as to facilitate the following cutting step.

Then, as shown in FIG. 4d, the cutting step is performed from the underside of the wafer to divide the resultant structure into the unit LEDs, and the tape is stretched to expose the side of the cut unit LEDs. A first dielectric film of a first refractivity and a second dielectric film of a second refractivity larger than the first refractivity are laminated alternating with each other for at least one time on the side and the underside of the unit LEDs. The lamination is performed to suitably form the first and second dielectric films with a desired thickness in order to realize the dielectric mirror layers.

The dielectric layer lamination as shown in FIG. 4d provides a plurality of LEDs 110 each having a dielectric mirror layer 119 on the side and the underside, in which the dielectric mirror layer 119 includes the first dielectric film of the first refractivity and the second dielectric film of the second refractivity. This embodiment illustrates that the same dielectric mirror layer 119 is also formed on the side of the each LED by adopting a desired process and material capable of sufficiently overcoming step coverage. This structure can improve the reflectivity at the side of the LED to further raise the luminous efficiency. On the other hand, although the reflection effect of the dielectric mirror layer cannot be expected because the dielectric films are not formed with suitable thickness on the side of the LED, the dielectric mirror layer coated on the side of the LED can function as a desirable insulation layer to improve ESC characteristics of the LED so that high reliability LEDs can be expected.

EXAMPLE

To demonstrate the improvement of brightness in the present invention, GaN LED according to the present invention was produced.

First, n-type GaN layer, InGaN/GaN MQW active layer and p-type GaN layer were grown on a sapphire substrate sequentially. Then, 7 pairs of $Al_2O_3$ film and $Si_3N_4$ film were formed as the present dielectric mirror layer on bottom and side surfaces of the resulting structure as the LED shown in FIG. 2A. In this example, the thickness of $Al_2O_3$ film was about 700 Å and the thickness of $Si_3N_4$ film was about 540 Å.

COMPARATIVE EXAMPLE

GaN LED of this comparative example is made in the same manner and material as the above example except that the dielectric mirror layer was employed.

Figure 5:
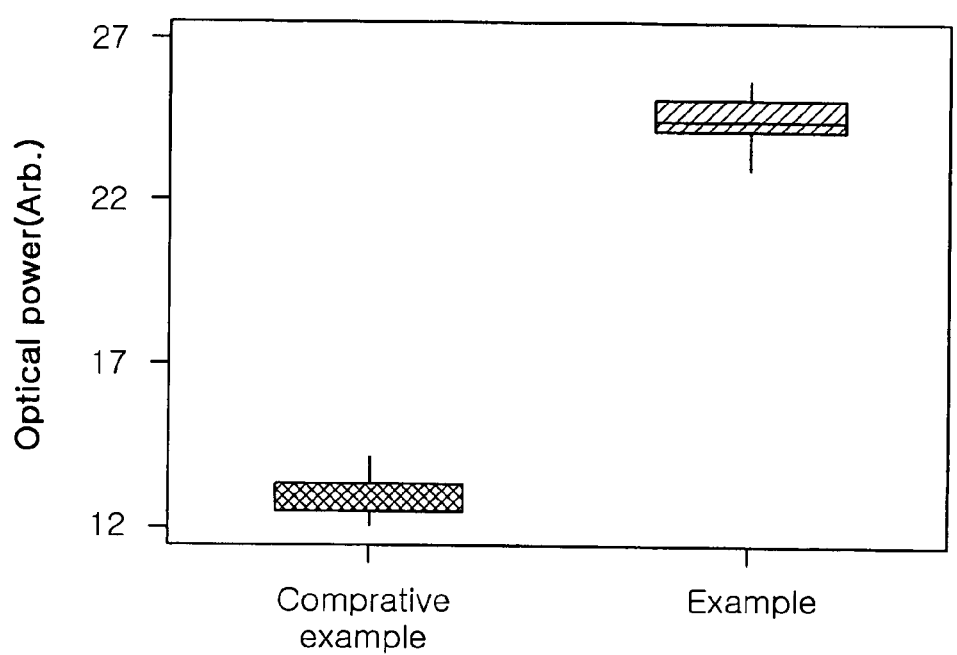
FIG. 5 is a graph showing Optical Power of the present example and the comparative example.

Then, the optical power of each LED was measured using a chip prober (OPTO corp. Japan). The result is shown in FIG. 5. Referring to FIG. 5, it can be observed that the LED according to the present example shows more optical power (increased about 90.2%) than that of the comparative example.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

According to the present invention as set forth above, the high reflectivity dielectric mirror layer including the alternating pair of dielectric films having different refractivities is formed on both the side and the underside of the LED to effectively collimate undesirably-directed light rays, which may be otherwise extinguished, thereby maximizing luminous efficiency. Furthermore, the dielectric mirror layer can also protect the side of the LED to remarkably improve ESD characteristics of the LED.

What is claimed is:

1. A nitride semiconductor Light Emitting Diode (LED) comprising:
    a transparent substrate for growing nitride semiconductor single crystal thereon;
    a light emitting structure including a first nitride semiconductor layer, an active region, and a second nitride semiconductor layer formed in that order on the substrate; a dielectric mirror layer formed on the underside of the substrate and having at least a pair of first dielectric film of a first refractivity and a second dielectric film of a second refractivity larger than the first refractivity, the first and second dielectric films being laminated on each other an alternating fashion; and
    a lateral insulation layer formed on the side of the substrate and the light emitting structure.

2. The nitride semiconductor light emitting diode according to claim 1, wherein the lateral insulation layer comprises a dielectric mirror layer equal to the dielectric mirror layer formed on the underside of the substrate.

3. The nitride semiconductor light emitting diode according to claim 1, wherein the first and second dielectric films comprise oxide or nitride containing one element selected from a group including Si, Zr, Ta, Ti and Al.

4. The nitride semiconductor light emitting diode according to claim 1, wherein each of the first and second dielectric films has a thickness of about 300 to 900 Å.

5. The nitride semiconductor light emitting diode according to claim 1, wherein each of the first and second dielectric films comprises a $SiO_2$ film or a $Si_3N_4$ film.

6. The nitride semiconductor light emitting diode according to claim 5, wherein the $SiO_2$ film has a thickness of about 600 to 600 Å, and the $Si_3N_4$ film has a thickness of about 400 to 600 Å.

7. The nitride semiconductor light emitting diode according to claim 1, wherein the dielectric mirror layer has a reflectivity of at least 90%.

8. The nitride semiconductor light emitting diode according to claim 7, wherein the dielectric mirror layer has a reflectivity of at least 95%.

* * * * *